United States Patent
Casagrande (10) Patent No.: US 6,760,398 B2
(45) Date of Patent: Jul. 6, 2004

(54) SWITCHED PHASE DUAL-MODULUS PRESCALER CIRCUIT HAVING MEANS FOR REDUCING POWER CONSUMPTION

(75) Inventor: Arnaud Casagrande, Lignières (CH)

(73) Assignee: Asulab S.A., Marin (CH)

( * ) Notice: Subject to any disclaimer, the term of this patent is extended or adjusted under 35 U.S.C. 154(b) by 0 days.

(21) Appl. No.: 10/252,446

(22) Filed: Sep. 24, 2002

(65) Prior Publication Data

US 2003/0068003 A1 Apr. 10, 2003

(30) Foreign Application Priority Data

Oct. 5, 2001 (CH) ............................................. 1842/01

(51) Int. Cl.[7] .............................................. H03K 21/00
(52) U.S. Cl. ......................................... 377/47; 377/48
(58) Field of Search ..................................... 377/47, 48

(56) References Cited

U.S. PATENT DOCUMENTS

| | | | |
|---|---|---|---|
| 4,754,235 A | | 6/1988 | Fujiwara |
| 5,859,890 A | * | 1/1999 | Shurboff et al. ............... 377/48 |
| 6,009,139 A | * | 12/1999 | Austin et al. .................. 377/47 |
| 6,583,674 B2 | * | 6/2003 | Melava et al. ................. 331/16 |
| 6,614,274 B1 | * | 9/2003 | Shi et al. ..................... 327/115 |

OTHER PUBLICATIONS

Craninckx, J. et al, "A 1.75–Ghz/3–V Dual–Modulus Divide–by–128/129 Prescaler in 0.7–Mum CMOS", IEEE Journal of Solid–State Circuits, IEEE Inc. New York, USA, vol. 31, No. 7, Jul. 1, 1996, pp. 890–897.

* cited by examiner

Primary Examiner—Margaret R. Wambach
(74) Attorney, Agent, or Firm—Sughrue Mion, PLLC (57) ABSTRACT

The dual-modulus prescaler circuit for a frequency includes several dividers-by-two of the asynchronous type, connected in series, a phase selector unit (11) inserted between two of the dividers-by-two (10, 12a) and a control unit for supplying first control signals(S0, S1, S2, C1, C2) to the selector unit as a function of a selected mode. Said control unit receives four signals phase shifted by 90° with respect to each other from a first master-slave divider and supplies a selected one of the four phase shifted signals. The selector unit includes a first amplifying branch (21) receiving two first phase shifted signals (F2I, F2Ib), a second amplifying branch (22) receiving two second phase shifted signals (F2Q, F2Qb), and a selection element (23) connected to each branch. The first control signals (S0, S1, S2) are supplied to the first and second branches, and to the selection element for selecting one of the four phase shifted signals (F2) at one output in a determined division period. The selector unit (11) includes switching means (24, 26) controlled by second control signals (C1, C2) for disconnecting the electric power supply to one of the selection branches when the other branch is selected to supply one of the four phase shifted signals at the output of the selector unit.

9 Claims, 7 Drawing Sheets

SWITCHED PHASE DUAL-MODULUS PRESCALER CIRCUIT HAVING MEANS FOR REDUCING POWER CONSUMPTION

BACKGROUND OF THE INVENTION

The invention concerns a switched phase dual-modulus prescaler circuit having means for reducing power consumption. The dual-modulus prescaler or divider counter circuit forms part of a frequency synthesiser. Said circuit divides the frequency of at least a high frequency signal by a factor N in a first selected mode and by a factor N+M in a second selected mode. It includes several series connected dividers-by-two of the asynchronous type. One of these dividers-by-two is of the master-slave type for receiving two input signals in phase opposition and for supplying four signals phase shifted by 90° in relation to each other. The circuit also includes a phase selector unit inserted between two of the dividers-by-two for receiving the four phased shifted signals of the first master-slave divider and for supplying one of the four phase shifted signals selected at the second divider. Two selection branches of the selector unit each receive two of the four phase shifted signals. A selection element of the selector unit is connected to each branch to provide at the output of said unit one of the four phase shifted signals selected in a division period determined as a function of the mode selected. For the selection of the phase-shifted signals, first control signals are provided by a control unit to the two branches, as well as to the selection element.

Frequency synthesisers are used particularly in wireless communication systems or, more generally, in telecommunication systems, in order to supply high frequency signals. The high frequency signals are likely to be used, for example, for demodulating RF signals received.

Figure 1:
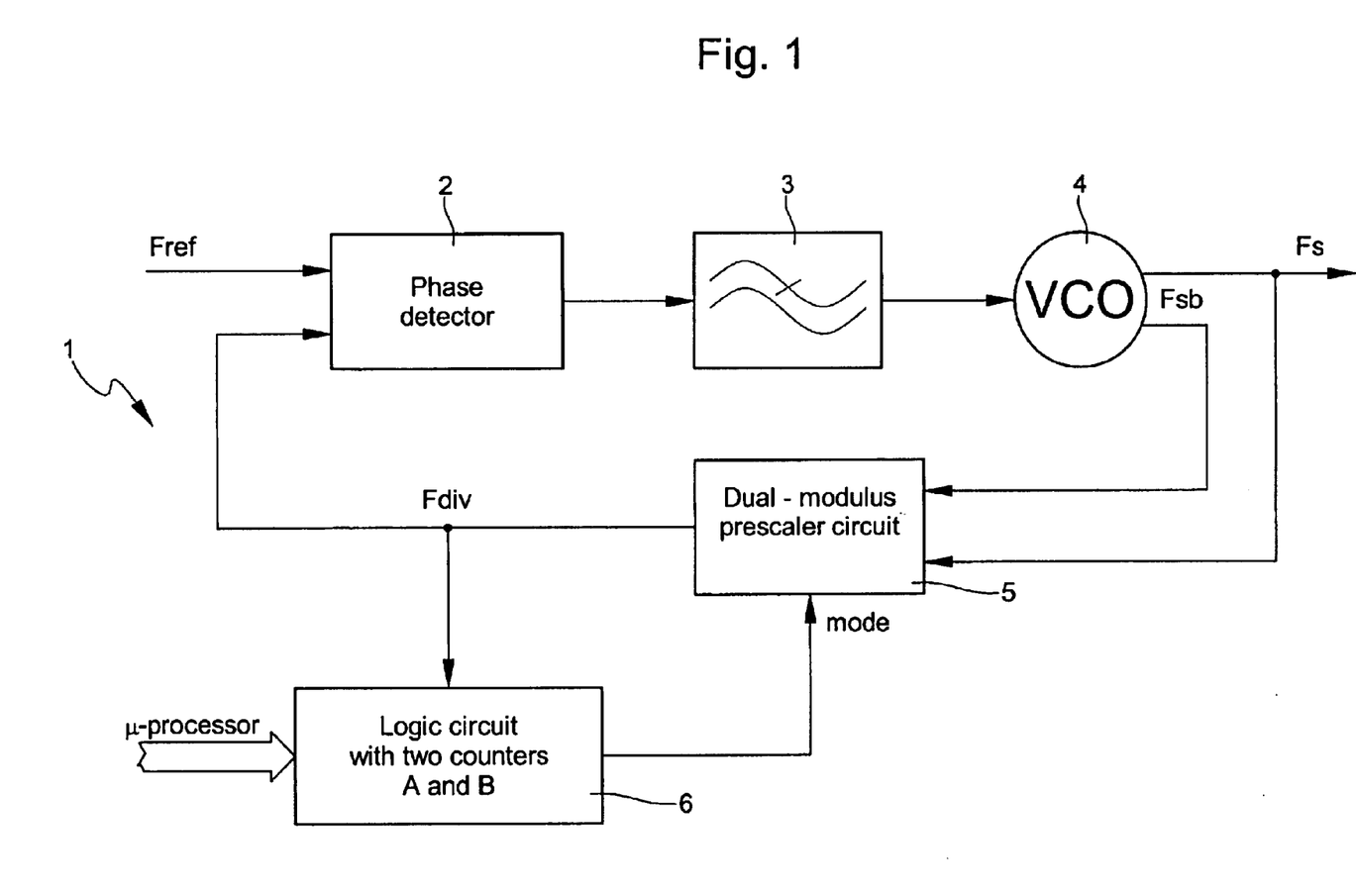
FIG. 1, already cited, shows a conventional frequency synthesiser with a dual-modulus prescaler circuit.

FIG. 1 shows an embodiment of a conventional frequency synthesiser with a dual-modulus prescaler circuit. This synthesiser includes first of all a reference oscillator, which is not shown. This oscillator supplies a frequency stable reference signal Fref to a phase and frequency detector 2. This detector also receives a divided frequency signal Fdiv from a dual-modulus prescaler circuit 5 in order to compare the reference signal and the divided frequency signal. As a function of the phase and frequency difference in signals Fref and Fdiv, the detector supplies a comparison signal to a low-pass filter 3 connected to a voltage controlled oscillator (VCO) 4. This voltage controlled oscillator receives a voltage control signal originating from the low-pass filter so that the oscillator generates at least a high frequency signal dependant on the comparison between signals Fref and Fdiv.

The voltage controlled oscillator can be a differential type oscillator so as to provide two high frequency signals Fs and Fsb in phase opposition to prescaler circuit 5 in a phase lock loop. At least one of high frequency signals Fs or Fsb can thus be used for demodulating operations in a radio-frequency signal receiver for example.

Dual-modulus prescaler circuit 5 has the power to allow frequency division by a division factor dependent on a selected mode. In order to do this, a logic circuit with two counters A and B is generally used to supply a mode selection to the prescaler circuit. This logic circuit 6, well known in this technical field, is controlled by a microprocessor and by divided frequency signal Fdiv. The two counters A and B are, in theory, clocked in synchronism by a same clock signal, but the number counted by each counter before zero reset is different. This thus allows logic circuit 6 to supply a mode signal to the prescaler circuit so as to change division mode in determined periods.

Several embodiments of dual-modulus type prescaler circuits have already been proposed, but since these circuits have to operate at high speed, they are more difficult to design than simple fixed division ratio frequency dividers. One of the difficulties is that, to obtain a frequency division in accordance with the first and second division factors, the logic part of the circuit slows down the whole circuit.

A conventional dual-modulus prescaler circuit, having to operate at high speed, includes a first synchronous division part, for the division factor selection, and a second asynchronous part. In general, the first synchronous division part is the only part operating at the highest frequency. This can be a drawback, since several flip-flops of the first division part are synchronised by the same signal, which is a high frequency signal, which involves high current consumption.

U.S. Pat. No. 6,067,339 discloses such a dual-modulus prescaler circuit. The circuit allows frequency division to be carried out in accordance with two division factors as a function of a selected mode. For example according to the mode selected, the factor can be equal to 64 or 65, or also to 128 or 130. This circuit includes several dividers-by-two, connected in series, of which one divider unit is synchronous to carry out a division by 4 or by 5, whereas the other dividers are of the asynchronous type.

This synchronous divider unit is arranged with a certain number of logic parts in order to allow the circuit to divide the high frequency signal by one of the two division factors that is selected. The unit includes two D type flip-flops clocked by the same clock signal which is an output signal of a first divider-by-two. However, one of the flip-flops of this unit is only used to obtain the division factor by 65 or by 130.

Usually, a synchronous divider unit of this type is intended to receive the high frequency signal directly. Thus, several flip-flops operate at high frequency, which is a drawback if one wishes to reduce the power consumption of such a prescaler circuit. One solution to this problem has been partially resolved by the circuit disclosed in U.S. Pat. No. 6,037,339, by placing a first divider-by-two of the asynchronous type before the synchronous divider unit. However, the first divider only divides the frequency of the high frequency signal by two, which means that the unit has to operate with a frequency that is still too high.

Another drawback with such a circuit arrangement is that the frequency division cannot be precisely adjusted in accordance with the two division factors, given that a first divider-by-two is particularly used for reducing the frequency of a high frequency signal. It is thus not possible to supply frequency divisions closer to each other.

In order to avoid the use of a synchronous divider unit, an embodiment of a dual-modulus prescaler circuit is presented in the article drafted by Messrs. Jan Craninckx and Michiel S. J. Steyaert, published in the IEEE integrated circuit journal, volume 31 of Jul. 7, 1996. This dual-modulus prescaler circuit includes only series connected dividers-by-two of the asynchronous type. This dual-modulus circuit thus includes a chain of seven asynchronous dividers-by-two interrupted by a phase selector unit to allow frequency division by 128 or 129. Only the first divider-by-two operates at the highest frequency, i.e. at the frequency of at least a received high frequency signal Fin.

A second divider-by-two of the master-slave type is connected to the first divider-by-two. This second master-slave divider is intended to supply four signals phase shifted by 90° in relation to each other to the phase selector unit on the basis of two phase-opposition signals supplied by the first divider. With respect to the first of the four signals supplied by the master-slave divider, the other signals are thus phase shifted by 90°, 180° and 270°. The selector unit includes two differential amplifiers for amplifying and selecting the four phase shifted signals, and selection means for supplying one of the four signals selected at output.

The selector unit is controlled by a logic control unit as a function of the mode selected. In a first selected mode, said circuit has to divide the frequency of the high frequency signals by a division factor equal to 128. In this case, for all the division periods, the selector unit selects only one of the four signals. In a second selected mode, said circuit has to divide the frequency of the high frequency signals by a division factor equal to 129. In order to obtain this factor, phase switching between two of the four phase shifted signals is carried out in the selector unit as a function of the control signals generated by the control unit. At each division period, phase switching between a first signal supplied by the second divider and a second signal in a phase delay of 90° with respect to the first signal is thus carried out. For this purpose, the control unit is clocked by the output signal of the last divider-by-two to thus supply control signals to the phase selector unit for the phase switching at each division period.

In order to modify the state of the control unit as a function of a selected mode, a NAND type logic gate receives, on the one hand, the mode signal and the output signal from the last divider-by-two. When the mode signal has a value of 0, the variation in the output signal at the control unit has no effect. Conversely, when the mode signal has a value of 1, the output signal is inverted by the NAND gate in order to clock the control unit and allow the selector unit to carry out the signal phase switching.

One drawback of such an arrangement of the logic gate and the NAND gate is that the control part of the selector unit is no longer entirely of the synchronous type. Consequently, a logic signal switching delay can occur, which is not desired even if such a delay can allow drops in potential to be prevented during the signal phase switching at the output of the selector unit.

Another drawback of the solution disclosed in the article by Messrs. Craninckx and Steyaert is that the amplifiers of the selector unit consume a significant amount of current in order to amplify the relatively high frequency signals. Consequently, the essential purpose of the selector unit inserted between two dividers-by-two of the chain of dividers is not to reduce the power consumption of the circuit with respect to a conventional dual-modulus prescaler circuit.

SUMMARY OF THE INVENTION

The main object of the present invention is thus to overcome the drawbacks of the prior art by providing a high speed dual-modulus prescaler circuit having means for reducing the power consumption of said circuit.

The invention therefore concerns a dual-modulus prescaler circuit of the aforecited type, where in the selector unit includes switching means controlled by second control signals supplied by the control unit so as to disconnect the electric power supply of one of the selection branches during a period in which the other branch is selected for supplying one of the four phase shifted signals at the output of the selector unit.

One advantage of the dual-modulus prescaler circuit according to the invention is that the current of the selector unit can be greatly reduced without affecting the circuit speed and the stability of the signals during switching. The decrease in current consumed can be 50% in a first selected mode and from 20 to 30% in the second selected mode.

In the first selected mode, the frequency of the high frequency signals is divided by a factor N equal, for example, to 64. In the second selected mode, the frequency of the high frequency signals is divided by a factor of N+M equal, for example, to 64.5. Thus, in the first mode at each division period, one of the amplifying branches of the selector unit is electrically powered, whereas the other branch is disconnected from the electric power supply. Conversely, in the second selected mode, the amplifying branches are inversely or alternately powered and disconnected from the electric power supply at each division period. The disconnected branch normally has to be powered a time period preceding switching between the branches, which is why the saving in power consumption is only 20 to 30%.

Another advantage of the dual-modulus prescaler circuit according to the invention, is that it is possible to have division factors sufficiently close so that the frequency of the high frequency signals can be adjusted precisely in the phase lock loop of the frequency synthesiser.

Another advantage of the dual-modulus prescaler circuit according to the invention, is that the control unit is clocked synchronously by a clock signal corresponding to the output signal of the latter or the second to last divider-by-two of the chain of dividers. This clock signal is thus never interrupted to clock the operations in the control unit. Moreover, the control signals produced by said control unit are exempt of any disturbance and/or any delay. Each control signal, for the amplifiers of each branch, is stabilised before each change in signals to be selected by a selection element of the selector unit.

It should be noted that the use of dividers-by-two, in particular of the asynchronous type, in the chain of dividers, facilitates manufacture of said high speed dual-modulus prescaler circuit.

BRIEF DESCRIPTION OF THE DRAWINGS

The objects, advantages and features of the dual-modulus prescaler circuit will appear more clearly in the following description of embodiments illustrated by the drawings, in which.

DETAILED DESCRIPTION OF THE INVENTION

In the following description, all the components of the dual-modulus prescaler circuit, which are well known to those skilled in the art in this technical field, will not be explained in detail. However, the following description presents in more detail the means allowing the power consumption to be reduced and all problems to be prevented during switching of the signals of such a circuit.

As described hereinbefore with reference to FIG. 1, the dual-modulus prescaler circuit is used in a control loop of a frequency synthesiser. This synthesiser can be used for example in radio-frequency transmitters and/or receivers fitted to portable devices of small size for short-range wireless communication. The frequency of the radio-frequency signals for short-range communications is close to 0.5 GHz, for example 434 MHz. Generally, this synthesiser is used to supply high frequency signals for radio-frequency signal demodulating operations. The synthesiser can be provided to be fitted, for example, to a wristwatch that includes a battery or accumulator of small size. Thus, it is necessary for the dual-modulus prescaler circuit to consume only a small amount of current during the synthesiser's operating periods.

The dual-modulus prescaler circuit, that forms the subject of the invention, is based in part on the circuit presented in the article drafted by Messrs Jan Craininckx and Michiel S. J. Steyaert, published in the integrated circuit IEEE journal, volume 31 of Jul. 7, 1996. Thus, the reader can refer to said article for more design details of certain equivalent elements of the dual-modulus prescaler circuit, forming the subject of the invention.

Figure 2:
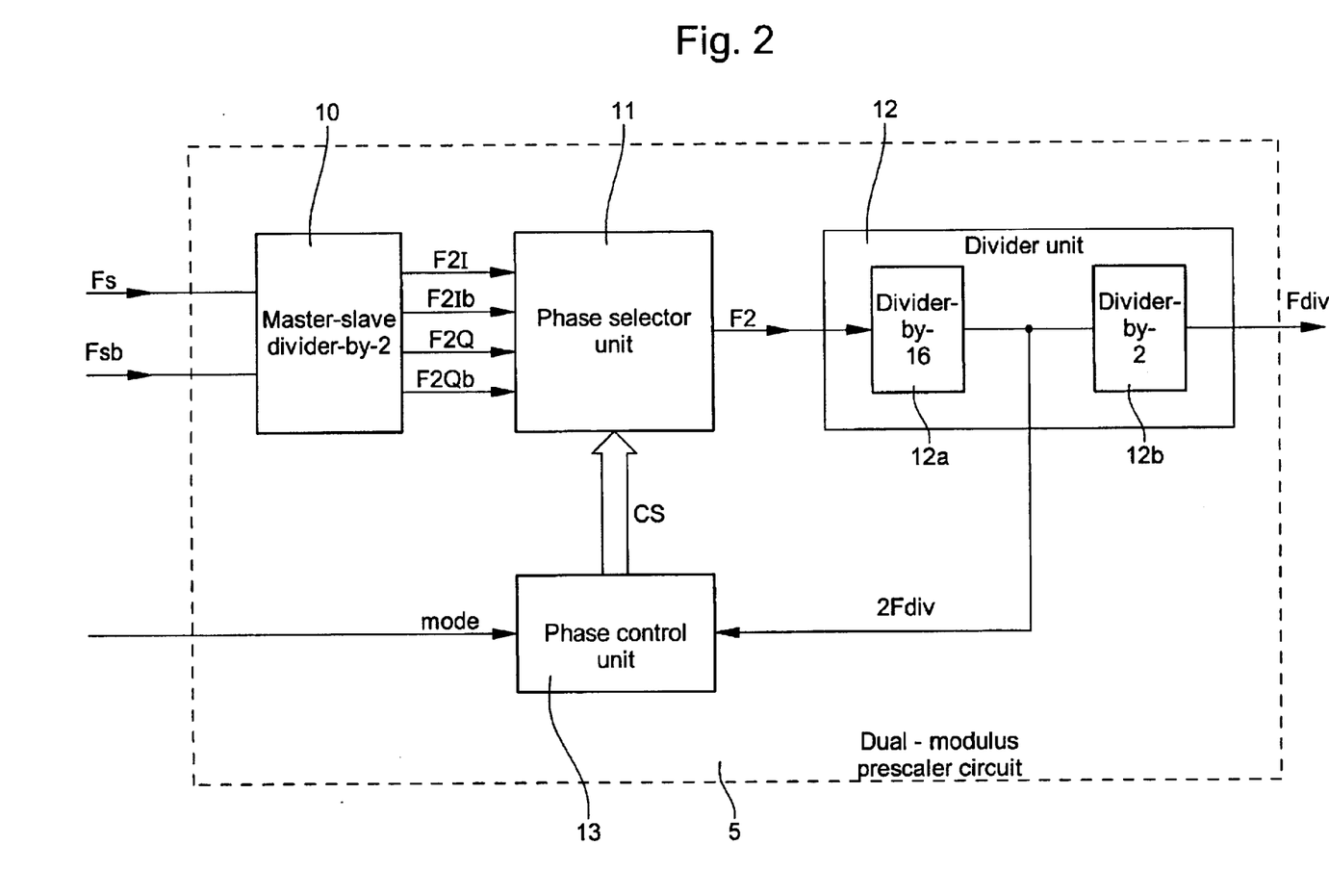
FIG. 2 shows schematically the different elements that form the dual-modulus prescaler circuit according to the invention.

The various elements of dual-modulus prescaler circuit 5 are presented in FIG. 2. The circuit is intended to operate a division by a factor N in a first selected mode and by a factor N+M in a second selected mode. Preferably, factor N is equal to 64, which is a power of 2, whereas factor N+M is equal to 64.5. Of course, other factor division values can be chosen. If the selector unit is for example inserted between the second and third dividers-by-two, the division factors will be 64 or 65.

Dual-modulus prescaler circuit 5 includes a chain of asynchronous dividers-by-two 10, 12, a phase selector unit 11 inserted between two dividers-by-two, and a phase control unit 13 connected to the selector unit to provide the latter with control signals CS that are dependant on the mode selected.

The first divider-by-two 10 is a master-slave divider. This divider supplies, to phase selector unit 11, four signals phase shifted by 90° with respect to each other F2I, F2Ib, F2Q and F2Qb as a function of two phase-opposition high frequency signals Fs and Fsb. The two high frequency signals are supplied by the differential voltage controlled oscillator (VCO) of the synthesiser. It should be noted that the first master-slave divider is the only element which operates at the highest frequency.

Figure 3:
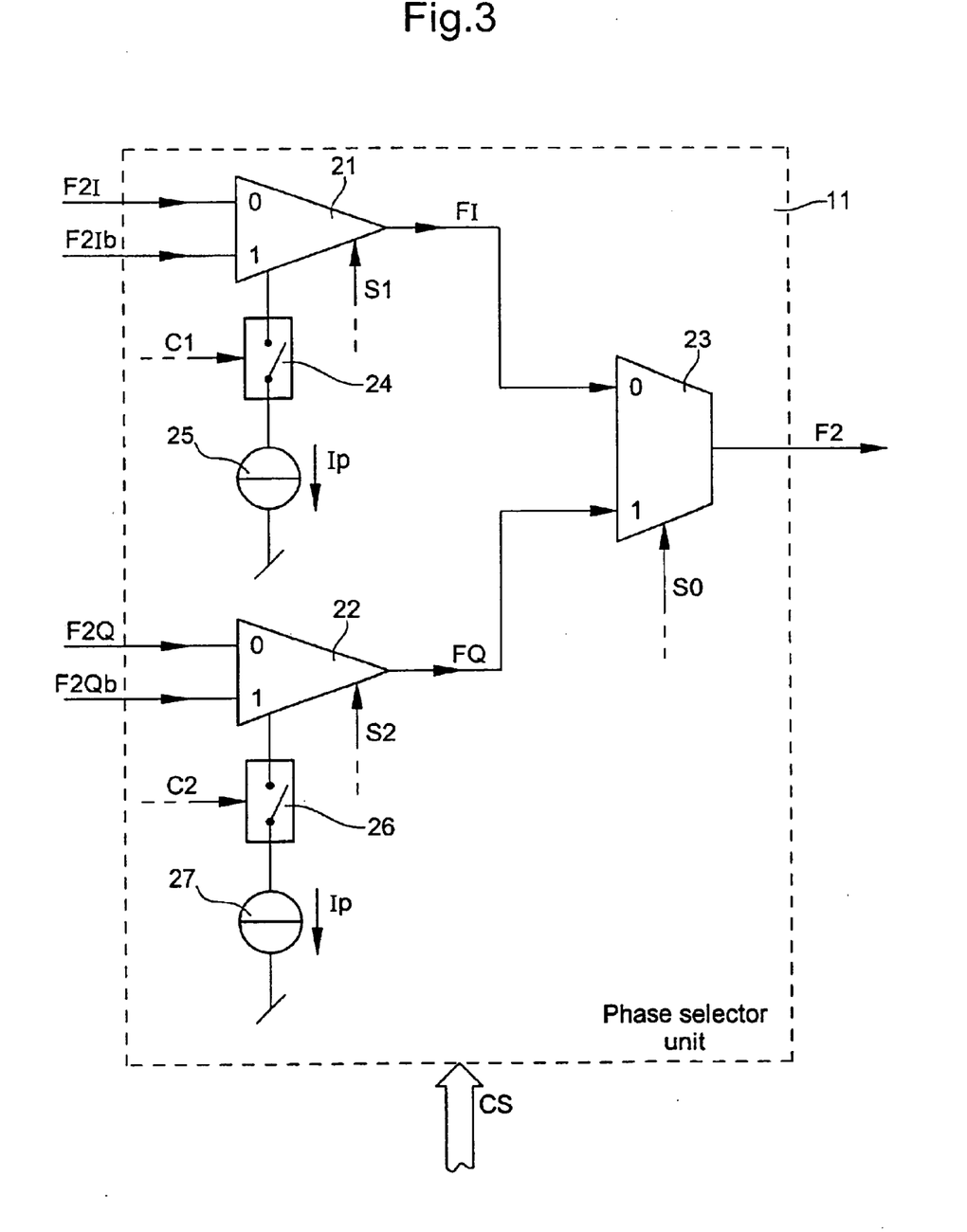
FIG. 3 shows the components of the phase selector unit of the dual-modulus prescaler circuit according to the invention.

Phase selector unit 11, which will be explained in more detail with reference to FIG. 3, is inserted between first master-slave divider 10 and the first divider-by-two of divider unit 12. In a first selected mode, no phase switching occurs in phase selector unit 11. Thus, the selector unit only selects one of the four phase shifted signals to supply an output signal F2 at the same frequency as the selected phase shifted signal. The same phase shifted signal constitutes output signal F2 of the selector unit at each division period. This division period is defined with respect to the frequency of the divided frequency signal Fdiv at the output of the prescaler circuit. In this first mode, control signals CS supplied by the control unit thus do not vary with time.

In a second selected mode, phase switching occurs in the selector unit at the end of each division period. Phase switching in the selector unit corresponds to a transition between a first signal received at the input of the selector unit and a second signal in phase delay of 90°. Thus, selector unit 11 receives control signals CS, certain of which change state at each division period 1/Fdiv for the phase switching. Since the phase difference between each phase-shifted signal is 90° and only one divider-by-two precedes the selector unit, the division factor can thus be equal to 64.5. Six dividers-by-two, associated with the phase selector unit, are used to obtain such a factor in the present invention. Phase switching, i.e. the transition between two of the four phase shifted signals at each division period, will be explained, particularly with reference to FIG. 5a.

The frequency of output signal F2 originating from phase selector unit 11 is divided in a divider-by-sixteen 12a of divider unit 12. This divider-by-sixteen is simply four dividers-by-two of the asynchronous type connected in series. The output signal 2Fdiv of this divider-by-sixteen will be used as a clock signal for phase control unit 13 in order to clock the operations processed by the control unit. Finally, a last divider-by-two 12b of divider unit 12 supplies the divided frequency signal Fdiv necessary for comparison in the phase and frequency detector of the frequency synthesiser.

The phase selector unit, which is the main element of this circuit particularly for reducing power consumption, will now be explained with reference to FIG. 3. This selector unit 11 is formed of two selection branches. These amplifying branches each include a differential amplifier 21 and 22. Each amplifier 21 or 22 receives two of the four phase shifted signals originating from the first master-slave divider. Since the signals of this divider have relatively low amplitude, said signals have to be amplified using these two branch amplifiers.

Amplifier 21 receives, for example, the positive and negative phase signals F2I and F2Ib, i.e. two first phase opposition signals, whereas amplifier 22 receives positive and negative quadrature signals F2Q and F2Qb, i.e. two second phase opposition signals. A selection of one of the two signals is made in each branch using first control signals S1, S2. A control signal S1 allows either signal F2I, or signal F2Ib to be selected. When control signal S1 has a value of 0, signal F2I is amplified and selected by amplifier 21, whereas when control signal S1 has a value of 1, the opposite signal F2Ib is amplified and selected by amplifier 21. Likewise, a control signal S2 allows either signal F2Q or signal F2Qb to be selected. When control signal S2 has a value of 0, signal F2Q is amplified and selected by amplifier 22, whereas when control signal S2 has a value of 1, the opposite signal F2Qb is amplified and selected by amplifier 22. It is clear that the selection of phase-shifted signals for each amplifier can be changed, but for the present invention it is preferable to select the signals described above for each amplifier.

The amplifiers are powered for example, each by a current source 25 and 27 whose current value Ip must be sufficiently high to guarantee rapid operation of the dual-modulus prescaler circuit. In order to reduce the power consumption of the prescaler circuit, it is thus recommended that the electric power supply is cut off, i.e. one of the current sources of the amplifier of the branch that is not used in the division period, is disconnected. In order to do this, in the first branch, a first switch 24 is connected in series between a terminal of the current source 25 and a terminal of amplifier 21 for its electric power supply. In the second branch, a second switch 26 is connected in series between a terminal of current source 27 and a terminal of amplifier 22 for its electric power supply.

Switches 24, 26 are controlled by second control signals produced by the phase control unit so as to connect or disconnect each current source 25, 27. In the first branch, when control signal C1 is at 1, switch 24 is closed and allows current source 25 to power amplifier 21, whereas when signal C1 is at 0, switch 24 is open which cuts off the electric power supply to amplifier 21. In the second branch, when control signal C2 is at 1, switch 26 is closed and allows current source 27 to power amplifier 22, whereas when signal C2 is at 0, switch 26 is open which cuts off the electric power supply to amplifier 22.

As already mentioned hereinbefore, each branch not used in at least one division period is disconnected from the electric power supply. In the first selected mode, one of the two switches 24 or 26 remains open, and the other remains closed at each division period. This allows a saving of approximately 50% of the current consumed in said selector unit. In the second selected mode, the two switches 24 and 26 are, in theory, inversely or alternately closed and open so as to disconnect each unused branch from the electric power supply after each division period. However, when one of the phase shifted signals of a disconnected branch is selected in a subsequent division period, the switch of the disconnected branch has to be closed a period of time preceding the selection of the signal of said branch. The period of time can be equal to a half division period. This is necessary to stabilise the signals so as to prevent problems during phase switching.

Switches 24, 26 used in the selector unit can be MOS type transistors, for example NMOS. When the gate of each transistor is at 1, the transistor is conductive and allows the corresponding amplifier to be powered. When the gate of each transistor is at 0, the corresponding amplifier is not powered electrically. Of course, other types of switches can be used. Likewise, instead of powering each amplifier by the current source, a voltage source could be used. In this case, each switch has to be placed for example between a positive terminal of the voltage source and the power terminal of the corresponding amplifier.

Phase selector unit 11 also includes an element 23 for selecting one of the phase shifted signals to be supplied at the output of said unit. The selection element may be, for example, a multiplexer. This selection element receives signals FI and FQ from each branch, as well as a control signal S0 forming part of the first control signals. This signal S0 allows selection element 23 to select one or other of signals FI and FQ to be supplied at output.

Figure 5A:
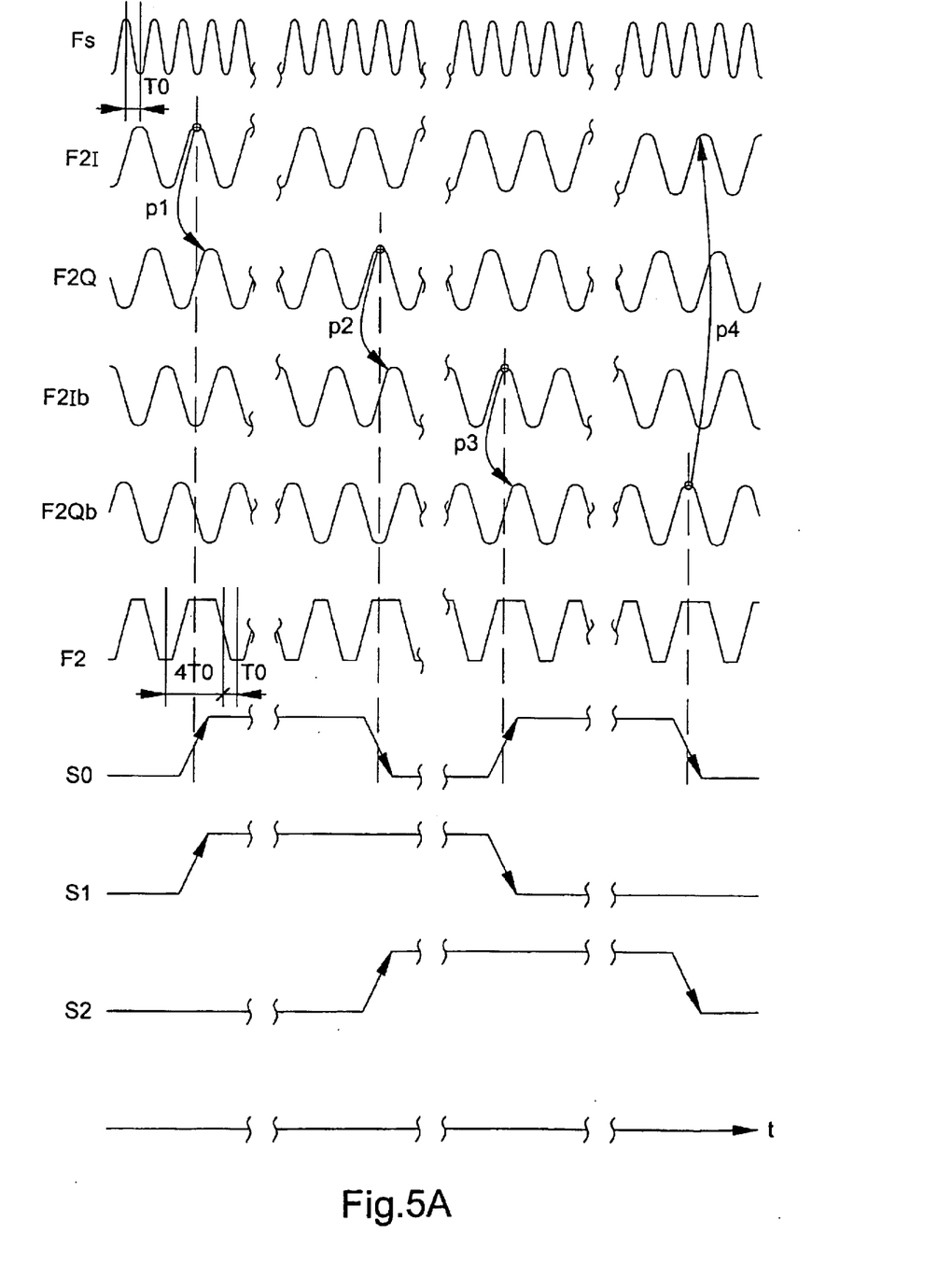
FIG. 5a shows graphs of the phase switching between phase shifted signals in the selector unit as a function of the transition of the control signals, as well as the output signal from the selector unit resulting from phase-switching of the phase-shifted signals.
Figure 5B:
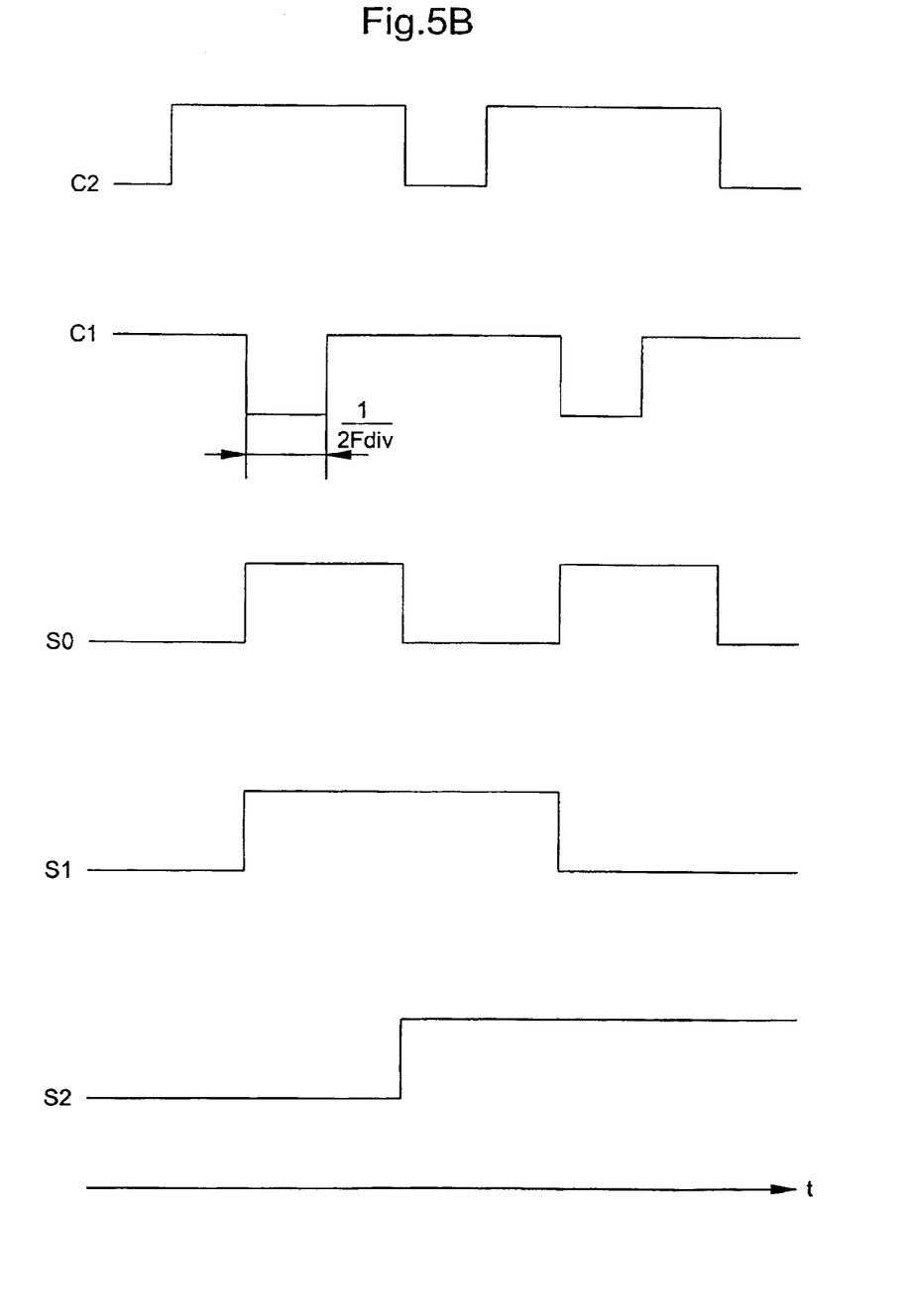
FIG. 5b shows graphs of the first and second control signals generated by the phase control unit of the dual-modulus prescaler circuit according to the invention.

The state of the first and second control signals is shown in FIG. 5b when the prescaler or divider counter circuit is in the second selected mode. It will be noted in this Figure that the two signals C1 and C2 are respectively at state 1 before each selection of the branch that has to supply one of the selected phase shifted signals. When control signal S0 passes from the 0 state to the 1 state to select one of the signals of the second branch, the powering of this branch has to be re-established for example a half division period beforehand by signal C2 at the 1 state. When control signal S0 passes from the 1 state to the 0 state to select one of the signals of the first branch, the powering of this branch also has to be re-established a half division period beforehand by signal C1 at the 1 state. The unused branch is thus only disconnected from the power supply for a half division period. Consequently, the current saving in this second mode is between approximately 20 and 30%.

Two embodiments of the phase control unit will now be described with reference to FIGS. 4a and 4b.

Figure 4A:
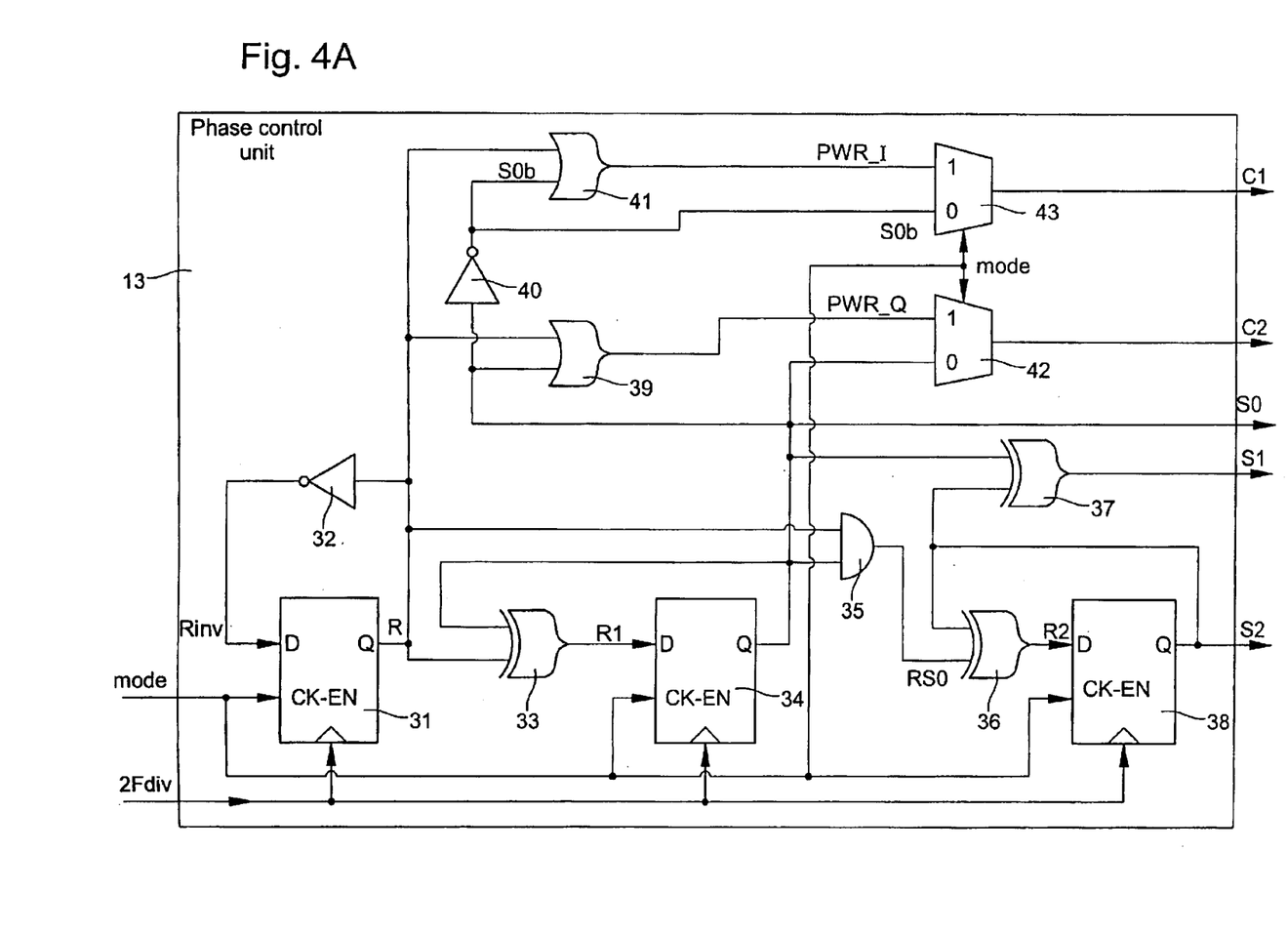
FIG. 4a shows a first embodiment of the control unit that is formed of several flip-flops and logic gates for the dual-modulus prescaler circuit according to the invention.

Phase control unit 13, shown in FIG. 4a, can be configured to supply control signals S0, S1, S2, C1 and C2 to the selector unit depending on the state of a mode signal. In this first embodiment, control unit 13 includes a sequential logic part and a combinatory logic part. The sequential logic part includes three flip-flops 31, 34 and 38, and the combinatory logic part includes an arrangement of logic gates 32, 33, 35, 36, 37, 39 to 43. It is to be noted that the sequential logic part is clocked synchronously by a single clock signal 2F$div$. This clock signal is the output signal of the second-to-last divider-by-two of the chain of dividers.

When the mode signal is at the 1 state, all the D type flip-flops transmit the state of the input signal to their output Q at each clock stroke produced by signal 2F$div$. Conversely, when the mode signal is at the 0 state, the state of the outputs of each flip-flop does not fluctuate at each clock stroke produced by signal 2F$div$.

An inverter 32 is connected between output Q of the first flip-flop 31 and the input D so that output signal R is inverted by said inverter to give signal Rinv. Consequently, at each clock stroke, signal R changes state. It passes from the low state to the high state when signal Rinv is at the high state and it passes from the high state to the low state when signal Rinv is at the low state.

A XOR logic gate 33 receives at input the signal R and output signal Q from second flip-flop 34, and supplies a signal R1 to the input of the second flip-flop. An AND logic gate 35 receives at input the signal R and output signal Q from the second flip-flop, and supplies a signal RS0. A XOR logic gate 36 receives signal RS0 from logic gate 35 and output signal Q from third flip-flop 38 and supplies a signal R2 to the input of the third flip-flop.

Control signal S0 corresponds to output signal Q of second flip-flop 34. Control signal S1 is obtained by a XOR logic gate 37 which receives at input the signal S0 and output signal Q of third flip-flop 38. Finally, control signal S2 corresponds to output signal Q of third flip-flop 38.

The second control signals C1 and C2 are obtained on the basis of control signal S0 and output signal R of first flip-flop 31. OR logic gate 41 adds signal R and a signal S0$b$, which originates from control signal S0 inverted by inverter 40, and supplies signal PWR_I. OR logic gate 39 adds signal R and signal S0, and supplies signal PWR_Q.

Multiplexer 43 receives signal S0$b$ and signal PWR_I. If the mode is at 1, said multiplexer 43 supplies signal PWR_I as control signal C1. If the mode is at 0, the multiplexer supplies signal S0$b$ as control signal C1.

Multiplexer 42 receives signal S0 and signal PWR_Q. If the mode is at 1, said multiplexer 42 supplies signal PWR_Q as control signal C2. If the mode is at 0, said multiplexer 42 supplies signal S0 as control signal C2.

The state of each control signal in the second selected mode, i.e. when the mode signal is at the 1 state is shown in FIG. 5a described hereinbefore.

Despite the relative complexity of this control unit and the multitude of flip-flops and logic gates for supplying the control signals, the power saving is nonetheless substantial. The control unit operates with signals whose frequency is more than 16 times lower than the phase shifted signals placed at the input of the amplifiers of each branch. The low current consumption of the flip-flops and logic gates of this unit 13 only very slightly affects the power consumption of the dual-modulus prescaler circuit compared to phase selector unit 11.

Figure 4B:
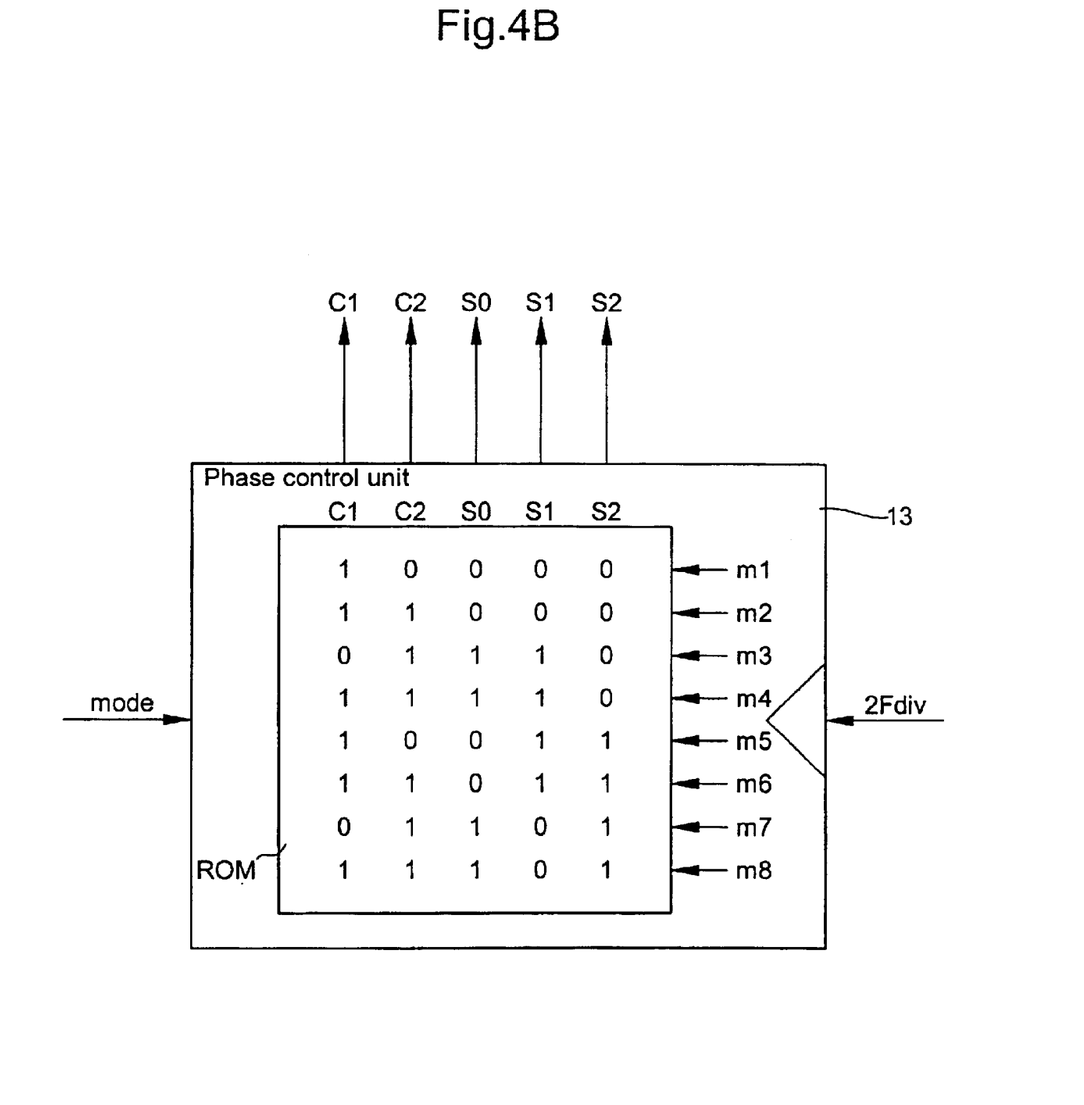
FIG. 4b shows a second embodiment of the control unit, which is formed of a non-volatile memory and a counter for addressing memory locations for the dual-modulus prescaler circuit according to the invention.

Phase control unit 13, shown in FIG. 4b, can be configured to supply first and second control signals C1, C2, S0, S1 and S2 to the phase selector unit depending on the state of a mode signal. In this second embodiment, phase control unit 13 includes a counter, not shown, and a ROM type non-volatile memory.

The ROM memory includes a certain number of memory locations in which 5-bit binary words are stored representing the state of each control signal at a given moment. In the second selected mode, all the memory locations can be addressed in succession cyclically by the counter. The counter thus passes from a preceding address of a memory location m1 to m8 to a successive address at each clock stroke. This clock signal is produced by the output signal 2F*div* of the second-to-last divider-by-two of the chain of dividers. Consequently, certain control signals change state at each clock stroke passing from a preceding memory location to a following memory location. In the first selected mode, only one memory location is selected in which one of the branches is disconnected when the other active branch supplies a selected signal. The memory location at address m1, for example, can be selected when the mode is at 0.

This control unit with the ROM memory will not be described in more detail, since it forms part of the general knowledge of those skilled in the art in this technical field.

The switching of the phase shifted signals in the phase selector unit as a function of the control signals is explained now with reference to FIG. 5a. This Figure shows several graphs of the signals in particular at the selector unit. The four phase switches p1 to p4 in the selector unit occurring at each division period are shown.

In the graphs, signals Fs, F2I, F2I*b*, F2Q and F2Q*b* are shown in approximately sinusoidal form. It should be noted that the first master-slave divider operates at high frequency, which is why it is more advantageous to have signals of sinusoidal shape rather than rectangular pulse signals. This avoids having a too broad frequency spectrum in the event that the signals have rectangular pulses, and allows the power consumption of the first divider to be reduced.

High frequency signal Fs has a frequency that can be of the order of 434 MHz. After the first divider-by-two, phase shifted signals F2I, F2Q, F2I*b* and F2Q*b* all have a frequency divided by two with respect to the frequency of signal Fs. With respect to signal F2I, signal F2Q has a phase delay of 90°, signal F2I*b* has a phase delay of 180° and signal F2Q*b* has a phase delay of 270°. Each signal F2I, F2Q, F2I*b* and F2Q*b* is thus phase shifted with respect to the other by a half period T0 of signal Fs.

When signal S2 is a the 0 state and signals S0 and S1 pass from the 0 state to the 1 state, a first phase switching p1 between signal F2I and F2Q occurs in the selector unit. Thus, output signal F2, which has to represent one of the selected phase shifted signals, has a pulse a half period T0 longer at the end of each division period due to the phase switching.

When signal S1 is at the 1 state and signal S0 passes from the 1 state to the 0 state and signal S2 passes from the 0 state to the 1 state, a second phase switching p2 between signal F2Q and F2I*b* occurs in the selector unit. Once again, the output signal F2 has a pulse longer by a half period of signal Fs at the end of the division period due to the phase switching.

When signal S2 is at the 1 state, and signal S0 passes from the 0 state to the 1 state and signal S1 passes from the 1 state to the 0 state, a third phase switching p3 between signal F2I*b* and F2Q*b* occurs in the selector unit. Again, output signal F2 has a pulse longer by a half period of signal Fs at the end of the division period due to the phase switching.

Finally, when signal S1 is at the 0 state and signals S0 and S2 pass from the 1 state to the 0 state, a fourth phase switching p4 between signal F2Q*b* and F2I occurs in the selector unit. Once again, output signal F2 has a pulse longer by a half period of signal Fs at the end of the division period due to the phase switching.

It is thus clear that by increasing the pulse of signal F2 by a half period of signal Fs at each division period, the prescaler circuit divides the frequency of signal Fs by 64.5.

It should also be noted that the dual-modulus prescaler circuit could enable the frequency of the high frequency signals, whose frequency is higher than 2 GHz, to be divided. However, when said signals have a relatively low frequency, certain voltage drop problems can occur during phase switching.

From the description that has just been given, multiple variants of the prescaler circuit can be envisaged by those skilled in the art without departing from the scope of the invention defined by the claims.

What is claimed is:

1. A dual-modulus prescaler circuit particularly for a frequency synthesiser, said circuit dividing the frequency of at least one high frequency signal by a factor N in a first selected mode and by a factor N+M in a second selected mode, said circuit including:

several asynchronous dividers-by-two connected in series, a first of the dividers-by-two being a master-slave divider for receiving two input signals in phase opposition and supplying four phase-shifted signals phase shifted by 90° in relation to each other, a phase selector unit, inserted between said first and a second of the dividers-by-two, for receiving the four phase shifted signals from the first of the two dividers-by-two which is the master-slave divider, and supplying one of the four phase shifted signals to the second of the two dividers-by-two, said chase selector unit including a first selection branch receiving two first ones of the four phase shifted signals, a second selection branch receiving two second ones of the four phase shifted signals, and a selection element connected to each branch, first control signals being supplied to the first and second selection branches, and to the selection element so that said phase selector unit supplies a selected one of the four phase shifted signals at one output of the phase selector unit in a division period determined as a function of a selected one of said first and second modes, and a control unit for supplying said first control signals to the phase selector unit, said control unit receiving an output signal, from one of the dividers-by-two, to clock operations in the control unit, and a signal for selecting one of said modes, wherein the chase selector unit includes switching means, controlled by second control signals supplied by the control unit, for disconnecting an electric power supply of one of the selection branches in a period when the other of the selection branches is selected to supply one of the four phase shifted signals at the output of the phase selector unit.

2. The prescaler circuit according to claim 1, wherein each branch is formed of a differential amplifier for amplifying the first or second ones of the received phase shifted signals, each amplifier being controlled by a respective one of the first control signals in order to supply at an output of said each amplifier one of the two first or second phase shifted signals applied to said each branch.

3. The prescaler circuit according to claim 1, wherein the phase selector unit is inserted between the first and second dividers-by-two to receive the four phase shifted signals from the first divider-by-two which is the master-slave divider.

4. The prescaler circuit according to claim 1, wherein said circuit includes six asynchronous dividers-by-two for obtaining a frequency division by a factor N equal to 64 in a first mode, in which the first control signals do not change state at each division period determined such that only one of the four phase shifted signals is selected in the phase selector unit at each division period, and for obtaining a frequency division by a factor N+M equal to 64.5 in a second mode, in which, for each determined division period, certain first control signals change state to phase switch between a first phase shifted signal and a second phase shifted signal in phase delay of 90° from the first phase shifted signal so that the phase selector unit supplies at one output a different one of the four phase shifted signals at the end of each division period.

5. The prescaler circuit according to claim 2, wherein the switching means include a first switch controlled by one of the second control signals for connecting or disconnecting the electric power supply to the differential amplifier of a first amplifying branch, and a second switch controlled by another of the second control signals for connecting or disconnecting the electric power supply to the differential amplifier of a second amplifying branch.

6. The prescaler circuit according to claim 5, wherein the second control signals are arranged to close the switch of one of the unused branches so as to power the corresponding amplifier a period of time preceding the selection of one of the phase shifted signals of said amplifier by the selection element.

7. The prescaler circuit according to claim 1, wherein the control unit includes a series of flip-flops, clocked in a synchronous manner by an output signal of a second to last one of said dividers-by-two, and an arrangement of logic gates for supplying control signals to the phase selector unit.

8. The prescaler circuit according to claim 1, wherein the control unit includes a non-volatile memory, in which several binary words are stored in determined locations, each binary word representing a state of the first and second control signals for each determined half division period, and a counter clocked by an output signal of the second to last divider-by-two so as to address a successive memory location at each transition of the counter in the second selected mode or to keep a determined memory location in the first selected mode.

9. The prescaler circuit according to claim 1, wherein the first branch receives two phase shifted signals in phase opposition, wherein the second branch receives two other phase shifted signals in phase opposition, and wherein the control signals are arranged such that, during phase switching between first and second phase shifted signals selected in the selection element of the selector unit, selection of the second phase shifted signal in one of the respective branches occurs in a period preceding phase switching in the selection element.

* * * * *

UNITED STATES PATENT AND TRADEMARK OFFICE
CERTIFICATE OF CORRECTION

PATENT NO. : 6,760,398 B2  
DATED : July 6, 2004  
INVENTOR(S) : Arnaud Casagrande It is certified that error appears in the above-identified patent and that said Letters Patent is hereby corrected as shown below:

<u>Column 10,</u>
Line 43, delete "said chase", and insert -- said phase --.
Line 59, delete "the chase", and insert -- the phase --.

Signed and Sealed this

Eighth Day of February, 2005

JON W. DUDAS
*Director of the United States Patent and Trademark Office*